(12) United States Patent
Hayo et al.

(10) Patent No.: US 7,027,962 B2
(45) Date of Patent: Apr. 11, 2006

(54) SYSTEM AND METHOD FOR SELF-CONFIGURING AND SELF-OPTIMIZING FILTERS

(75) Inventors: Jager Hayo, Raleigh, NC (US); Theodore F. Rivera, Raleigh, NC (US); Adam Tate, Raleigh, NC (US); Scott A. Will, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/717,678

(22) Filed: Nov. 19, 2003

(65) Prior Publication Data

US 2005/0108581 A1 May 19, 2005

(51) Int. Cl.
*G06F 15/00* (2006.01)
*H03F 1/26* (2006.01)

(52) U.S. Cl. .................................................. 702/197
(58) Field of Classification Search ................ 702/190, 702/197; 708/300; 340/488; 713/154
See application file for complete search history.

(56) References Cited

U.S. PATENT DOCUMENTS

| | | | |
|---|---|---|---|
| 4,179,730 A | | 12/1979 | Antonov et al. |
| 4,626,828 A | * | 12/1986 | Nishitani ............... 341/51 |
| 4,903,247 A | * | 2/1990 | Van Gerwen et al. ...... 367/135 |
| 5,321,837 A | * | 6/1994 | Daniel et al. .................. 707/4 |
| 5,867,799 A | | 2/1999 | Lang et al. |

FOREIGN PATENT DOCUMENTS

| | | |
|---|---|---|
| DE | 0559942 A1 | 9/1993 |
| GB | WO9909664 A1 | 2/1999 |
| JP | 2000295145 A | 8/2000 |

OTHER PUBLICATIONS

Xiaoming et al., "Development of Interactive Learning Control Strategy for Active Power Filter," IEEE Canadian Conference on Electrical and Computer Engineering Conference Proceedings, May 12-15, 2002, p. 240-245.
Ren et al., "Stochastic Adaptive Prediction and Model Reference Control," IEEE Transactions on Automatic Control, vol. 39, No. 10, Oct. 1994, p. 2047-2060.

\* cited by examiner

*Primary Examiner*—John Bailey
*Assistant Examiner*—Demetrius Pretlow
(74) *Attorney, Agent, or Firm*—VanLeeuwen & VanLeeuwen; Gerald R. Woods

(57) ABSTRACT

A system and method for self-configuring and self-optimizing filters is presented. A computing device monitors the number of occurrences of event types at particular stages in a data stream and adjusts filter properties in order to maximize processing efficiency based upon the number of event types that the computing device receives. The computing device may reconfigure, reorder, or create an exception filter based upon the analysis of the event types. The computing device may also pre-configure filter stages using historical data based upon a time of day, a time of month, or a time of year.

22 Claims, 10 Drawing Sheets

300 →

| | PRE-DEFINED FILTERING | | |
|---|---|---|---|
| FILTER | TIME | TYPE | CATEGORY |
| 1 | 8am-9am | A | H |
| | 2pm-4pm | C | H |
| 2 | 8am-9am | B | H |
| | 2pm-4pm | A | H |

325 — row 1
330 — row 2
310 — TIME, 315 — TYPE, 320 — CATEGORY

| | NUMBER OF OCCURRENCES | | | | | | | |
|---|---|---|---|---|---|---|---|---|
| | CATEGORY H | | | | CATEGORY J | | | |
| MONITOR POINT | A | B | C | SUB TOTAL | L | M | N | SUB TOTAL |
| X | 100 | 300 | 100 | 500 | 10 | 60 | 30 | 100 |
| Y | 0 | 300 | 100 | 400 | 0 | 60 | 30 | 90 |
| | CATEGORY H EVENTS PROCESSED | | | 900 | CATEGORY J EVENTS PROCESSED | | | 190 |

*Figure 3B*

SYSTEM AND METHOD FOR SELF-CONFIGURING AND SELF-OPTIMIZING FILTERS

BACKGROUND OF THE INVENTION

1. Technical Field

The present invention relates in general to a system and method for self-configuring and self-optimizing filters. More particularly, the present invention relates to a system and method for reconfiguring and reordering filters based upon the amount of event types that an autonomic computer system receives.

2. Description of the Related Art

Within the past two decades, the development of raw computing power coupled with the proliferation of computer devices has grown at exponential rates. This phenomenal growth, along with the advent of the Internet, has led to a new age of accessibility to other people, other systems, and to information.

The simultaneous explosion of information and integration of technology into everyday life has brought on new demands for how people manage and maintain computer systems. The demand for information technology professionals is already outpacing supply when it comes to finding support for someone to manage complex, and even simple computer systems. As access to information becomes omnipresent through personal computers, hand-held devices, and wireless devices, the stability of current infrastructure, systems, and data is at an increasingly greater risk to suffer outages.

This increasing complexity, in conjunction with a shortage of skilled information technology professionals, points towards an inevitable need to automate many of the functions associated with computing today. Autonomic computing is one proposal to solve this technological challenge. Autonomic computing is a concept to build a computer system that regulates itself much in the same way that a person's autonomic nervous system regulates and protects the person's body.

An important aspect of a computer system, and of autonomic computing, is filtering data based upon a certain set of criteria. A computer system typically includes multiple filter stages whereby each stage filters a particular event type. A filter spends processing time for each piece of data that the filter receives. For example, if a filter receives 10,000 pieces of data, the filter processes each of the 10,000 pieces of data. Therefore, in order to minimize the total amount of filter processing time, the filters should be configured such that the highest number of received event types are filtered during the first filter stage so subsequent stages are not required to process the event types. Using the example described above, if the 8,000 of the 10,000 pieces of data are of event type "A", then the first filter should filter event type A's such that the subsequent filters are left to process 2,000 pieces of data.

A challenge found, however, is that the data that a computer system receives changes dynamically. During one part of a day, the computer system may receive an over abundance of event type B's while during another part of the day the computer system may receive an over abundance of event type C's.

What is needed, therefore, is a system and method that monitors data event types and dynamically adjusts filter properties based upon the amount of a particular event type.

SUMMARY

It has been discovered that the aforementioned challenges are resolved by monitoring the number of occurrences of event types at particular stages in a data stream and adjusting filter properties in order to maximize processing efficiency based upon the number of event types that a computing device receives.

The computing device receives data which corresponds to particular event types, such as event types A, B, and C. When the computing device receives data, the data passes through a series of filters, such as a first filter, a second filter, and a third filter. Each filter is configured to filter particular event types. For example, the first filter may filter event type A's. Before each filter, the computing device monitors the number of occurrences of each event type.

The computing device receives event type information from each monitor point and stores the event type information in a look-up table. The computing device analyzes the data in the look-up table, identifies the event type with the most number of occurrences, and then reconfigures or reorders the filter stages based upon the event type analysis.

The computing device may also configure the filter stages based upon historical data. For example, the computing device may regularly receive an over abundance of event type B's in the morning and an over abundance of event type C's in the evening. In this example, the computer system may pre-configure the first filter stage to filter event type B's between 8:00 am–11:00 am and then configure the first filter stage to filter event type C's between 3:00 pm and 5:00 pm.

In one embodiment, the computer system may configure a filter stage as an exception filter. An exception filter filters an event that may have a plurality of event types, such as event type "AX". In this embodiment, the computer system identifies that it is receiving an over abundance of AX event types and configures its first filter stage as an exception filter to process AX event types.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIG. 3A is a table showing pre-defined filter combinations for a particular time of day;

FIG. 3B is a table showing the amount of event type occurrences at particular monitor points;

DETAILED DESCRIPTION

The following is intended to provide a detailed description of an example of the invention and should not be taken to be limiting of the invention itself. Rather, any number of variations may fall within the scope of the invention which is defined in the claims following the description.

Figure 1:
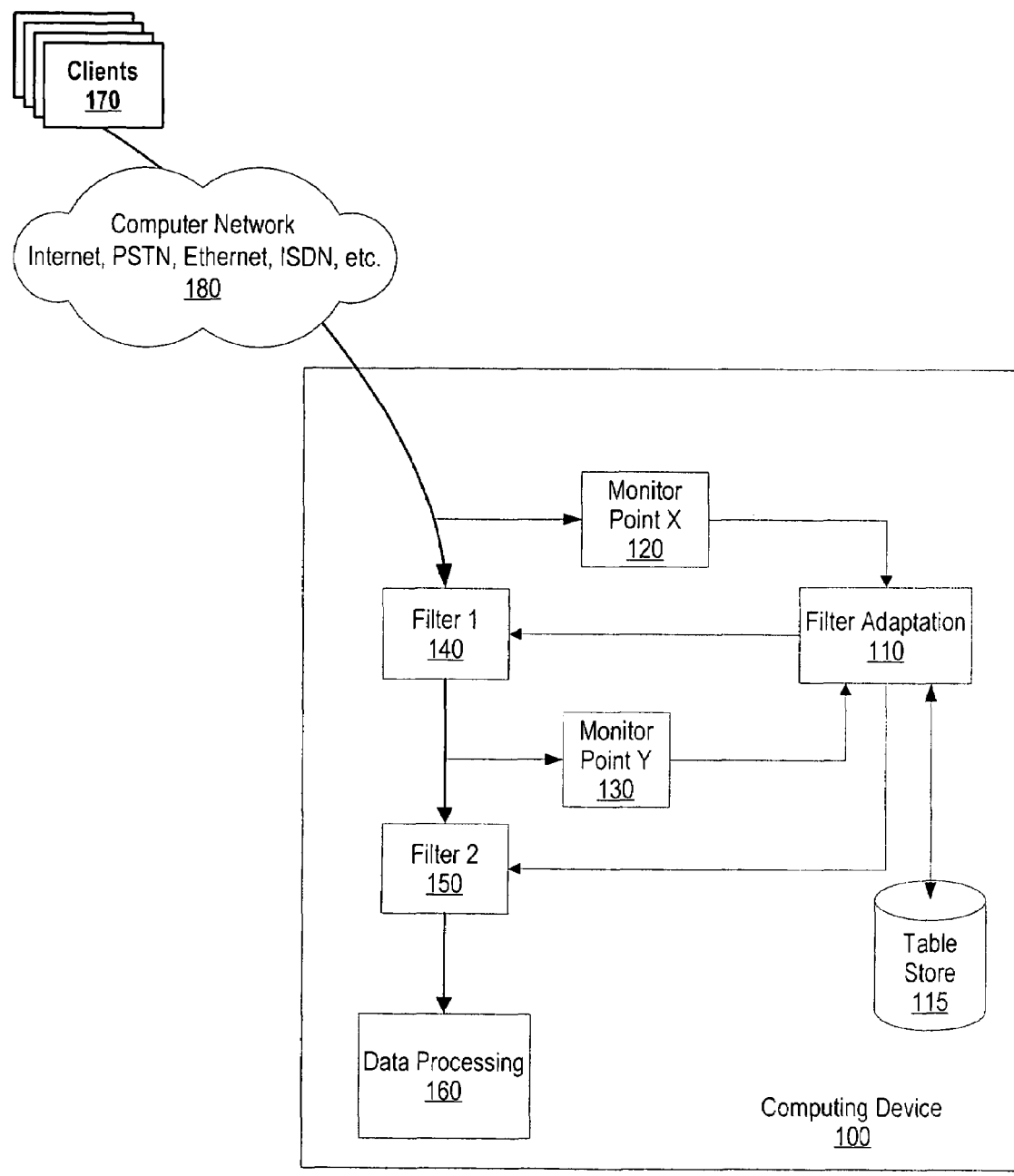
FIG. 1 is a diagram showing a computing device adjusting filter properties based upon event type input.

FIG. 1 is a diagram showing a computing device adjusting filter properties based upon event type input. Computing device 100 receives data from clients 170 over computer network 180, such as the Internet. The data corresponds to a filter category and an event type. For example, a filter category may be "interrupts" which may have event types "A", "B", and "C."

When computing device 100 receives data, the data passes through filter 1 140, through filter 2 150, and is then processed by data processing 160. Computing device 100 includes monitor points, such as monitor point X 120 and monitor point Y 130, that track the data's properties and event types at particular points in the data stream. The example in FIG. 1 shows that monitor point X 120 tracks data prior to filter 1 140 whereas monitor point Y 130 tracks data after filter 1 140 but prior to filter 2 150.

Filter adaptation 110 receives data input from monitor point X 120 and monitor point Y 130, and stores the data in table store 115. Table store 115 may be stored on a non-volatile storage area, such as a computer hard drive. Filter adaptation 110 analyzes the data in table store 115, and adjusts properties of filter 1 140 and/or filter 2 150 accordingly. For example, at a particular time of day, clients 170 may send an overabundance of event type "C's". In this example, filter adaptation 110 may adjust filter properties of filter 1 140 to filter event type "C's" (see FIGS. 6 through 9, and corresponding text for further details filter property adjustments).

Figure 2A:
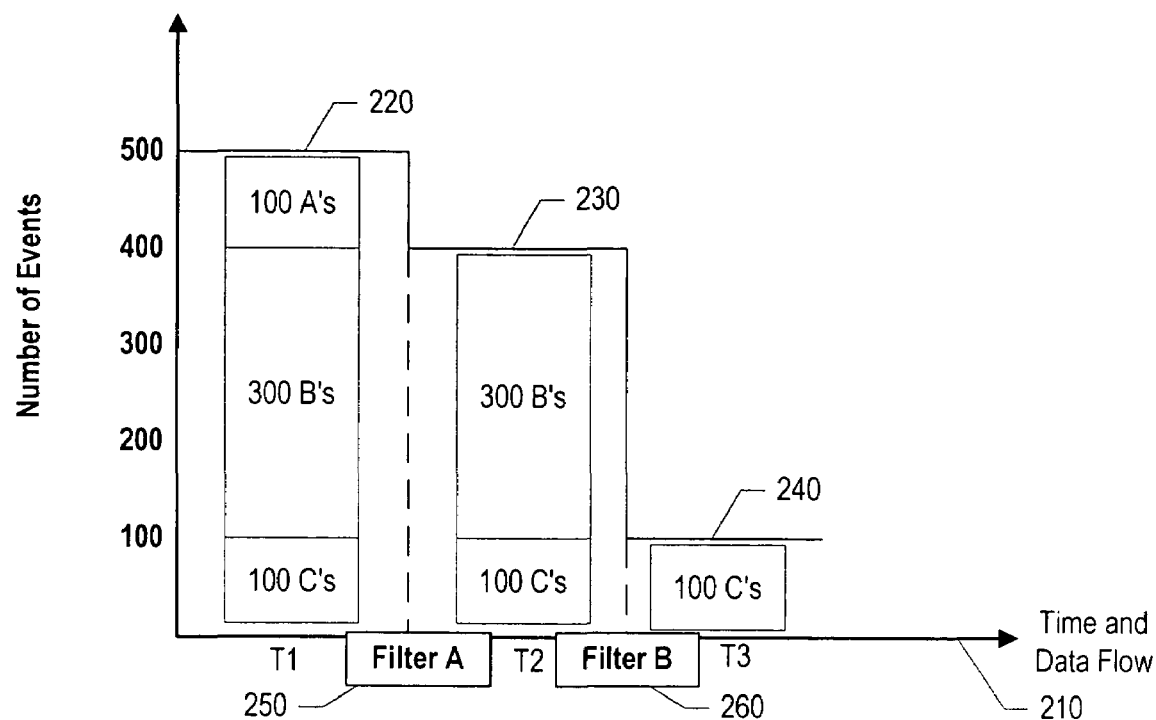
FIG. 2A is a graph showing an amount of event occurrences that a computing device processes using a first filter combination.

FIG. 2A is a graph showing an amount of event occurrences that a computing device processes using a first filter combination. FIG. 2A shows time and data flow 210 whereby the data first passes through filter A 250 and then passes through filter B 260. Prior to filter A 250 at column 220 (e.g. time T1), FIG. 2A shows that there are 100 event type A's, 300 event type B's, and 100 event type C's. After passing through filter A 250 which filters out event type A's, column 230 shows that 300 event type B's and 100 event type C's remain. After passing through filter B 260 which filters out event type B's, column 240 at time T3 shows that 100 event type C's remain. During the filtering process, the computing device processes 500 events at filter A 250 and 400 events at filter B 260, totaling 900 events. The computing device is able to decrease the total amount of events that it processes by analyzing the number of occurrences of each event type and reordering the filters based upon its analysis (see FIG. 2B and corresponding text for further details regarding a second filter combination).

Figure 2B:
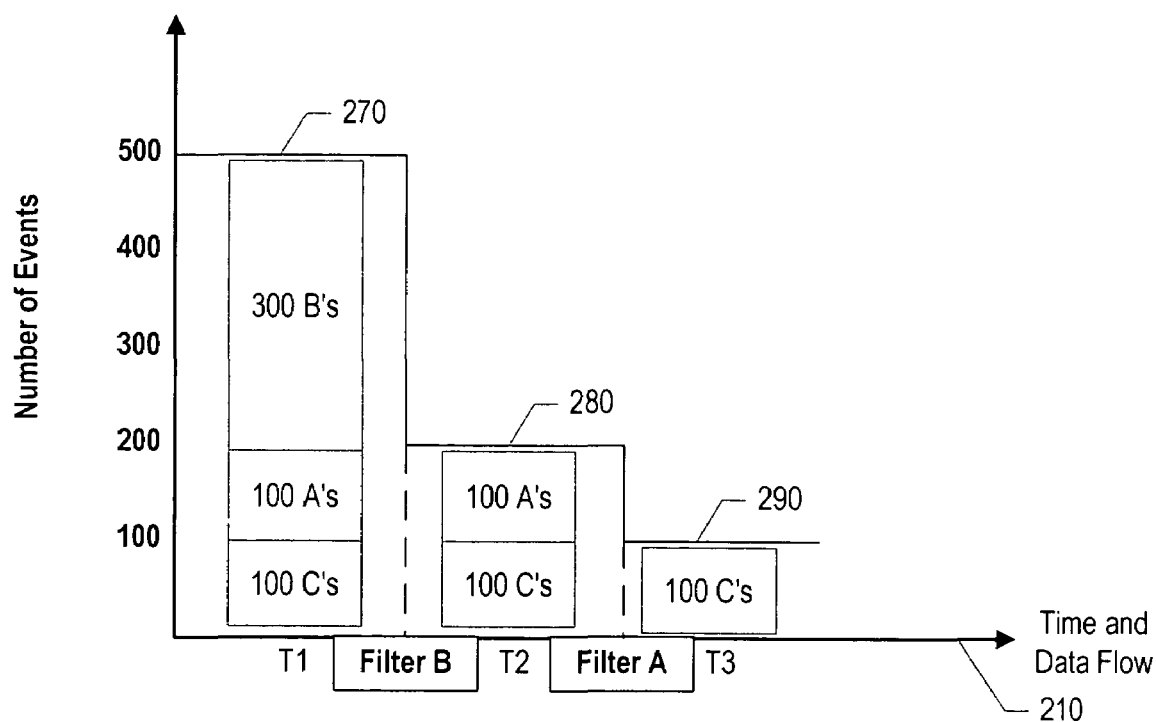
FIG. 2B is a graph showing an amount of event occurrences that a computing device processes using a second filter combination.

FIG. 2B is a graph showing an amount of event occurrences that a computing device processes using a second filter combination. The computing device analyzed event data that it received, and adjusted its filtering order based upon the number of occurrences of event types that it received (see FIG. 2A and corresponding text for further details regarding the computing device's first filter combination). The computing device identified that it is receiving more event type "B's" than any other event type and the computing device adjusted its first filter properties to filter event type "B's". FIG. 2B shows time and data flow 210 whereby the data now passes through filter B 260 first and then passes through filter A 250.

Prior to filter B 260 at column 270 (e.g. time T1), FIG. 2B shows that there are 100 event type A's, 300 event type B's, and 100 event type C's. After passing through filter B 260 which filters out event type B's, column 280 shows that 100 event type A's and 100 event type C's remain. After passing through filter A 250 which filters out event type A's, column 290 at time T3 shows that 100 event type C's remain. During the filtering process, the computing device processes 500 events at filter B 260 and 200 events at filter B 260, totaling 700 events. By comparing the amount of events that the computing device processed using the second filter configuration compared to the first filter combination that is shown in FIG. 2A, the computing device processed 200 less (900−700=200) events by reordering its filters (see FIGS. 6 through 9 and corresponding text for further details regarding filter property adjustments).

In one embodiment, a computing device uses the filter reordering technique described above to manage events types with multiple attributes. For example, if a computer system wishes to receive event types "AX", and is receiving both "AX" events as well as "AY" events, the computer system may configure its first filter such that it filters "AY" events.

FIG. 3A is a table showing pre-defined filter combinations for a particular time of day. Table 300 includes pre-defined filter combinations in which a computer system identified based upon historical data analysis. Table 300 includes pre-defined conditions for two filters which are filter 1 and filter 2. Row 325 includes pre-defined conditions for filter 1 and row 330 includes pre-defined conditions for the filter 2.

Column 310 includes particular times that pre-defined conditions should be configured on the two particular filters. Column 315 includes a list of the conditions that should be configured on the two particular filters corresponding to the times in column 310. Table 300 shows that between 8:00 AM–9:00 AM, filter 1 should be configured to filter event type "A" and filter 2 should be configured to filter event type "B". Table 300 also shows that between 2:00 PM–4:00 PM, filter 1 should be configured to filter event type "C" and filter 2 should be configured to filter event type "A". Column 320 includes a list of filter categories in which each event type in column 315 corresponds. Table 300 shows that each of the event types correspond to category "H" (see FIGS. 3B, 8, and corresponding text for further details regarding categories and category reordering).

FIG. 3B is a table showing the amount of event type occurrences at particular monitor points. Table 335 includes a list of the number of occurrences for particular event types. Table 335 receives information from two monitor points (e.g. X and Y). Row 340 includes a list of event types which are detected at monitor point X and row 345 includes a list of event types which are detected at monitor point Y.

Table 335 has event types that correspond to two different categories. Column 350 includes a list of three event types that correspond to category "H" and column 375 includes a list of three event types that correspond to category "J". Table 335 tracks event type categories in order to determine when a computer system should reorder filters (see FIG. 8 and corresponding text for further details filter reordering).

Category H includes columns 355, 360, and 365, each listing the number of occurrences of a particular event type. Column 355 includes a list of the number of occurrences in which monitor point X and monitor point Y detected an event type "A". As can be seen in FIG. 3B, monitor X detected 100 event type A's and monitor Y detected zero event type A's. Column 360 includes a list of the number of occurrences in which monitor point X and monitor point Y detected an event type "B". As can be seen in FIG. 3B, monitor X detected 300 event type B's and monitor Y also detected 300 event type B's. Column 365 includes a list of the number of occurrences in which monitor point X and monitor point Y detected an event type "C". As can be seen in FIG. 3B, monitor X detected 100 event type C's and monitor Y also detected 100 event type C's. Column 370 includes a subtotal amount of events that each monitor detected for category H. As can be seen in FIG. 3B, monitor point X detected 900 events and monitor point Y detected 400 event types.

Category J includes columns 380, 385, and 390, each listing the number of occurrences of a particular event type. Column 380 includes a list of the number of occurrences in which monitor point X and monitor point Y detected an event type "L". As can be seen in FIG. 3B, monitor X detected 10 event type L's and monitor Y detected zero event type L's. Column 385 includes a list of the number of occurrences in which monitor point X and monitor point Y detected an event type "M". As can be seen in FIG. 3B, monitor X detected 60 event type M's and monitor Y also detected 60 event type M's. Column 390 includes a list of the number of occurrences in which monitor point X and monitor point Y detected an event type "N". As can be seen in FIG. 3B, monitor X detected 30 event type N's and monitor Y also detected 30 event type N's. Column 395 includes a subtotal amount of events that each monitor detected for category J. As can be seen in FIG. 3B, monitor point X detected 100 events and monitor point Y detected 90 event types.

Boxes 398 and 399 include a total number of category H and category J events, respectively, that the computer system processes. As can be seen in FIG. 3B, many more category H events are being processed than category J events and, therefore, the computer system may configure its filter ordering such that category H events are filtered before category J events.

In one embodiment, Table 335 may track a particular event that corresponds to more than one category. For example, a computer system may receive a numerous amount of event types "AX" whereby the event type corresponds to category H and category J. In this example, the computer system may wish to create an exception filter for the particular event type (see FIG. 9 and corresponding text for further details regarding exception filters).

Figure 4:
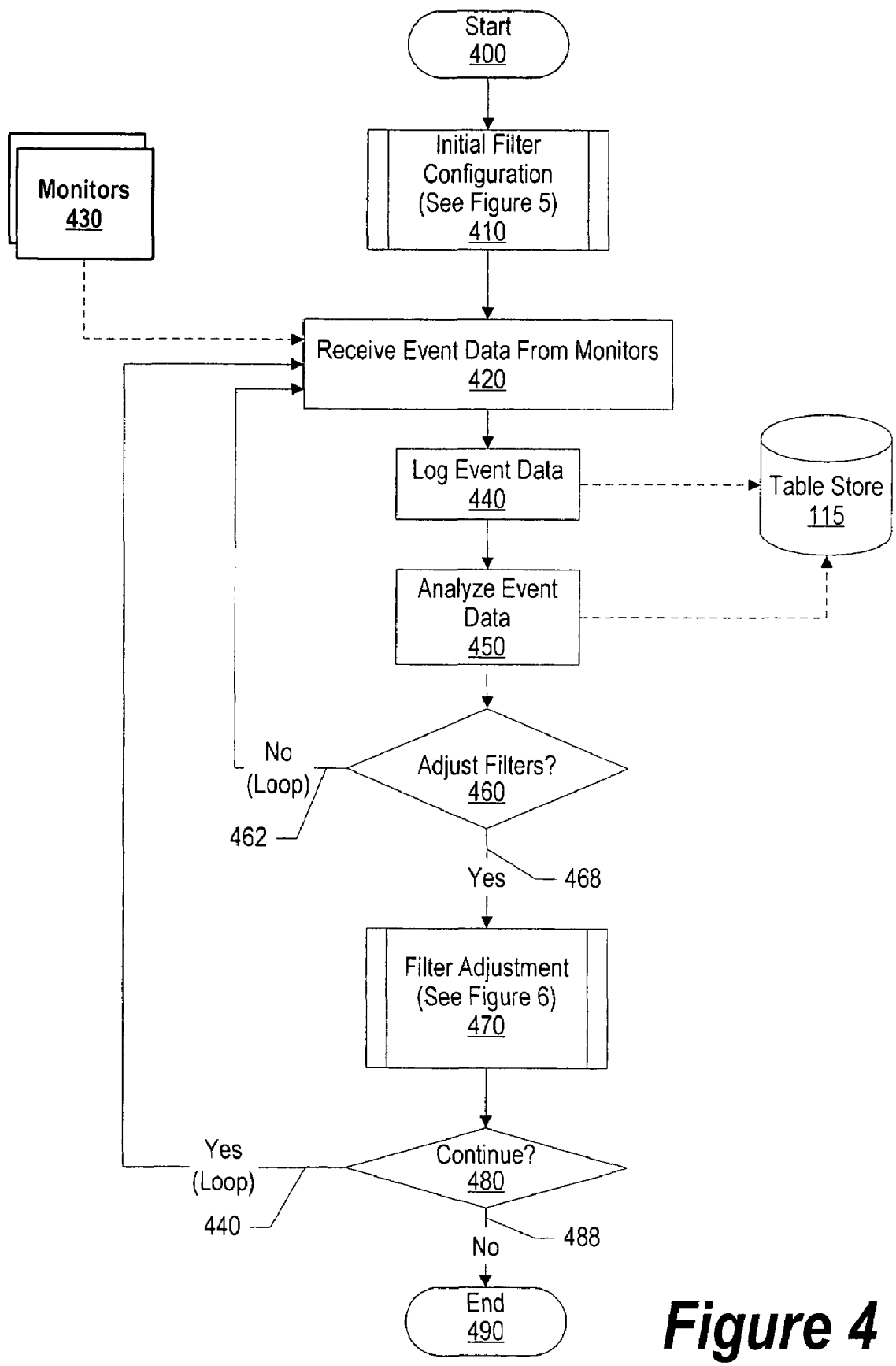
FIG. 4 is a high level flow diagram showing steps taken in initializing and adjusting filter properties.

FIG. 4 is a high level flow diagram showing steps taken in initializing and adjusting filter properties. Processing commences at 400, whereupon processing initializes and pre-configures one or more filters. For example, a computer system may configure a filter to filter an event type at particular times during the day (pre-defined process block 410, see FIG. 5 and corresponding text for further details).

Once the filters are configured, processing receives event data from monitors 430 at step 420 which detect event types that are received at particular points in a data flow (see FIG. 1 and corresponding text for further details regarding monitor points). Processing logs event data in table store 115 which includes an event type's value and its corresponding filter category (step 440). Table store 114 is the same as that shown in FIG. 1 and may be stored on a nonvolatile storage area, such as a computer hard drive.

Processing analyzes event data included in table store 115 at step 450. For example, processing may identify that it is receiving a particularly high number of occurrences of an individual event type in which the event type is not filtered until a later filtering stage. A determination is made as to whether to adjust the filters (decision 460). If processing should not adjust the filters, decision 460 branches to "No" branch 462 which loops back to continue to receive and process event data. This looping continues until processing determines that it should adjust the filters, at which point decision 460 branches to "Yes" branch 468 whereupon the filters are adjusted (pre-defined process block 470, see FIG. 6 and corresponding text for further details). For example, a filter may be configured using pre-defined configurations, and processing detects that it is not receiving event data corresponding to the pre-defined configuration. In this example, processing adjusts the filters based upon the type of event data is receiving.

A determination is made as to whether to continue to filter event data (decision 480). If processing should continue to filter data, decision 480 branches to "Yes" branch 482 which loops back to continue receiving and processing event data. This looping continues until processing should stop filtering data, at which point decision 480 branches to "No" branch 488 whereupon processing ends at 490.

Figure 5:
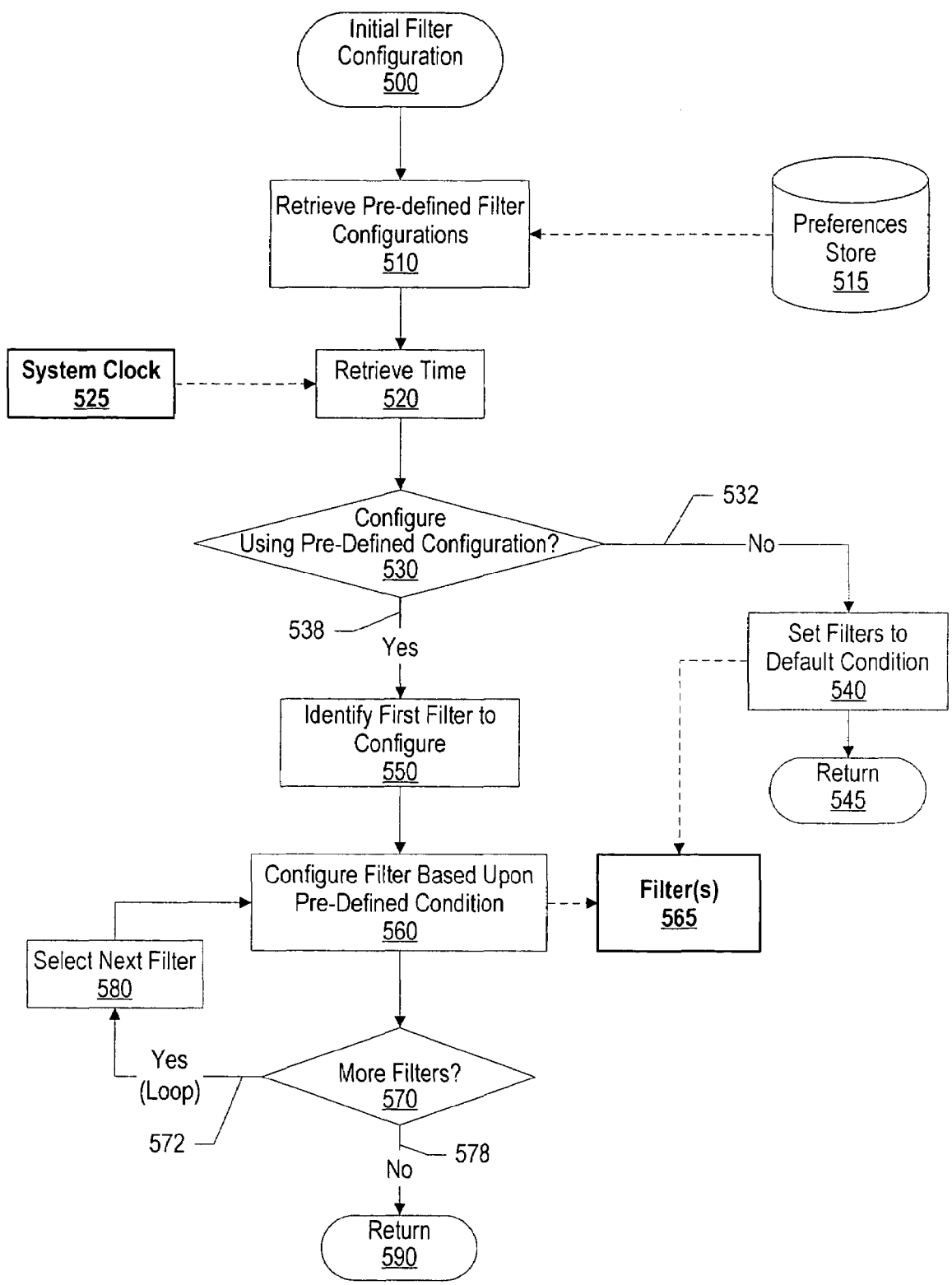
FIG. 5 is a flowchart showing steps taken in initially configuring filter properties.

FIG. 5 is a flowchart showing steps taken in initially configuring filter properties. Processing commences at 500, whereupon processing retrieves pre-defined filter configuration information from preferences store 515 (step 510). A pre-defined filter configuration may coincide with a particular time of day or a particular day (see FIG. 2A and corresponding text for further details regarding pre-defined filter configurations). Preferences store 515 may be stored on a nonvolatile storage area, such as a computer hard drive.

Processing retrieves the time of day from system time 525 at step 520. System time 525 may be a computer system's system clock. A determination is made as to whether to configure a filter using a pre-defined filter configuration (decision 530). For example, a computer system's initial configuration may not include historical data and, therefore, may not include pre-defined conditions. If processing should not configure a filter based upon re-defined filter conditions, decision 530 branches to "No", branch 532 whereupon processing sets each filter to a default configuration (step 540) and processing returns at 545.

On the other hand, if processing should configure a filter using a pre-defined condition, decision 530 branches to "Yes" branch 538 whereupon processing identifies a first pre-defined filter configuration at step 550. For example, the time of day may be 8:00 AM and a pre-defined filter configuration exists that should commence at 8:00 AM. Processing configures filters 565 based upon the first pre-defined condition at step 560. Filters 565 include a plurality of filters that are included in a particular data stream, each with separate filter properties (see FIG. 1 and corresponding text for further details regarding filter locations).

A determination is made as to whether there are more filters to configure based upon a pre-defined filter configuration (decision 570). If there are more filters to configure based upon a pre-defined filter configuration, decision 570 branches to "Yes" branch 572 which loops back to select (step 580) and configure the next filter. This looping continues until there are no more filters to configure, at which point decision 570 branches to "No" branch 578 whereupon processing returns at 590.

Figure 6:
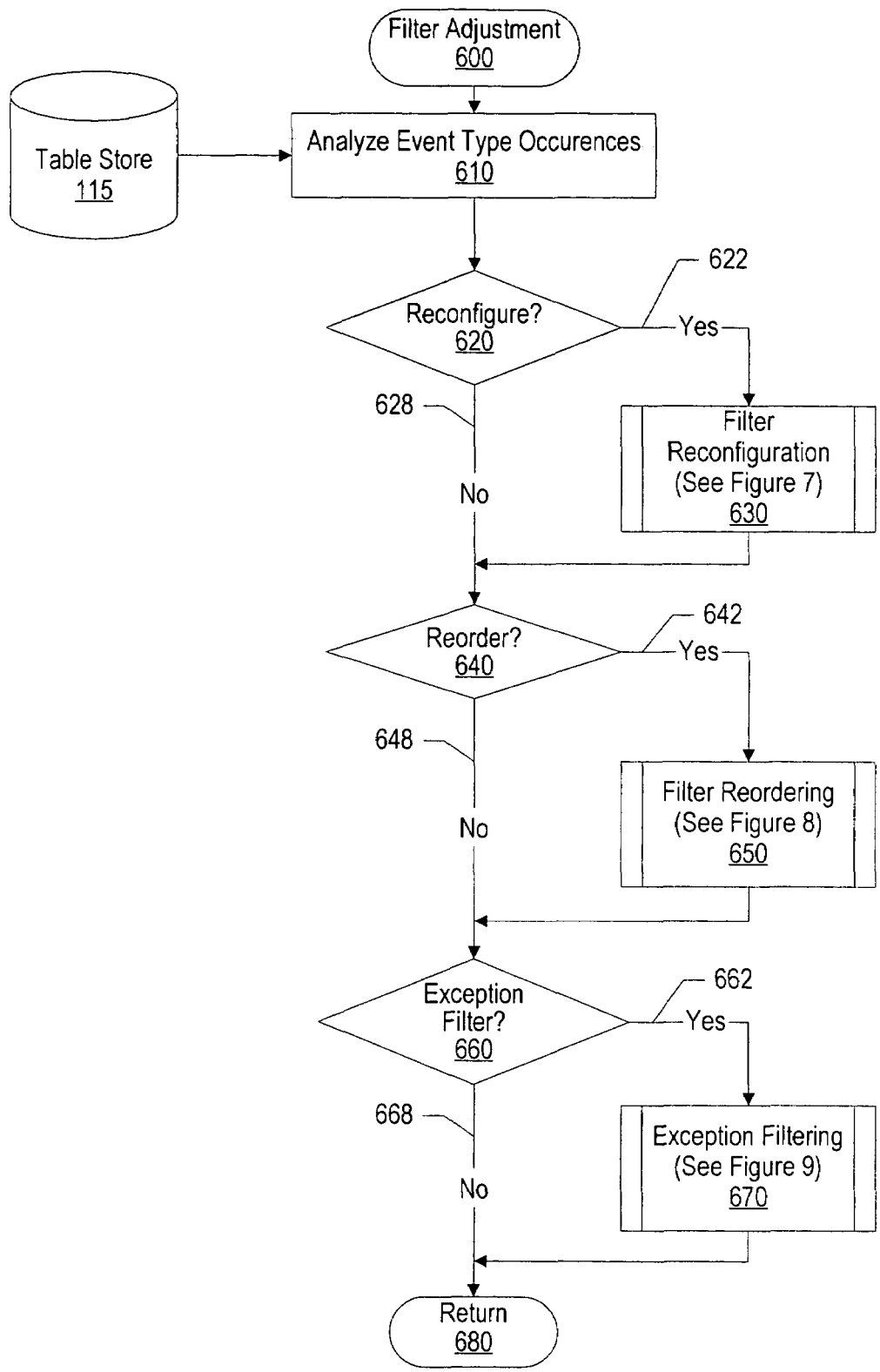
FIG. 6 is a high-level flowchart showing steps taken in adjusting filter properties.

FIG. 6 is a high-level flowchart showing steps taken in adjusting filter properties. Processing commences at 600, whereupon processing analyzes event occurrences that are stored in table store 115 (step 610). The event occurrences are retrieved at monitor points and tracked based upon their event type and the number of times that the particular event type occurs (see FIGS. 1, 2B, and corresponding text for further details). Table store 115 is the same as that shown in FIG. 1 and may be stored on a nonvolatile storage area, such as a computer hard drive.

A determination is made as to whether to reconfigure the filters in response to the event type analysis (decision 620). For example, a computer system may be receiving an over abundance of event type C's which it wishes to filter. If processing should reconfigure the filters, decision 620 branches to "Yes" branch 622 whereupon processing reconfigures the filters (pre-defined process block 630, see FIG. 7 and corresponding text for further details). On the other hand, if processing should not reconfigure the filters, decision 620 branches to "No" branch 628 bypassing filter reconfiguration steps.

A determination is made as to whether to reorder the filters in response to the event type analysis (decision 640). For example, processing may analyze the event type occurrences and determine that a majority of events are of category H and the first filter is currently filtering category J event types. If processing should reorder the filters, decision 640 branches to "Yes" branch 642 whereupon processing reorders the filters (pre-defined process block 650, see FIG. 8 and corresponding text for further details). On the other hand, if processing should not reorder the filters, decision 640 branches to "No" branch 648 bypassing filter reordering steps.

A determination is made as to whether to create an exception filter in response to the event type analysis (decision 660). For example, processing may analyze the event type occurrences and determine that a majority of event types include two categories and the events are of type "AX". If processing should create an exception filter, decision 660 branches to "Yes" branch 662 whereupon processing creates an exception filter (pre-defined process block 670, see FIG. 9 and corresponding text for further details). On the other hand, if processing should not create an exception filter, decision 660 branches to "No" branch 668 bypassing exception filtering steps. Processing returns at 680.

Figure 7:
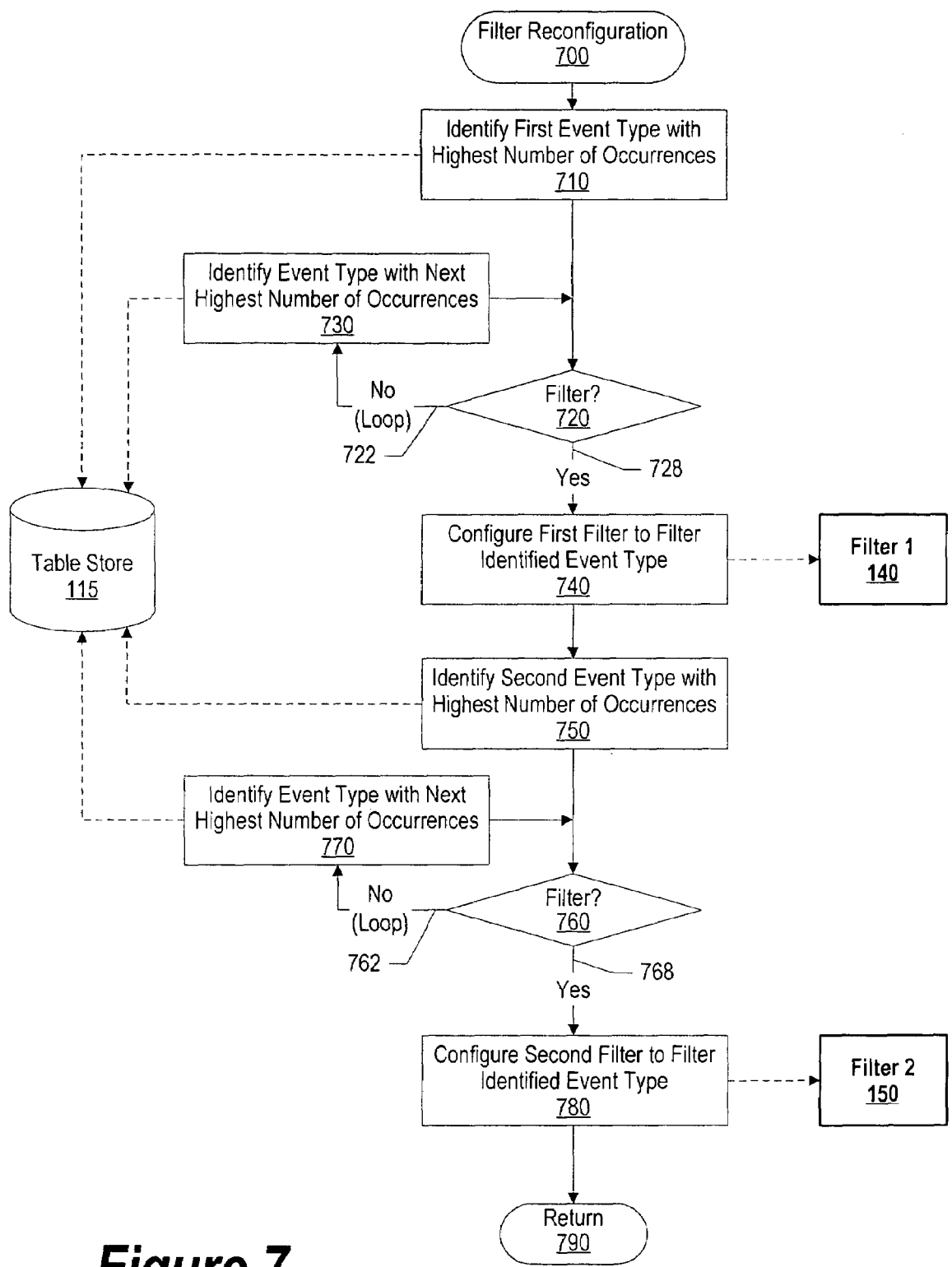
FIG. 7 is a flowchart showing steps taken in reconfiguring one or more filters.

FIG. 7 is a flowchart showing steps taken in reconfiguring one or more filters. Processing commences at 700, whereupon processing identifies a first event type located in table store 115 with the highest number of occurrences that corresponds to filter 1 140. For example, filter 1 140 may filter a first event category that includes event types "A", "B", and "C." Using this example, table store 115 may have three times as many occurrences of event type "A" than either of event type "B" or event type "C". Table store 115 is the same as that shown in FIG. 1 and may be stored on a nonvolatile storage area, such as a computer hard drive.

A determination is made as to whether to filter the event type with the most number of occurrences (decision 720). Using the example described above, processing determines if it should filter event types A's or whether it should pass event type A's through to a second filter. If processing should not filter the event type with the most number of occurrences, decision 720 branches to "No" branch 722 which loops back to select (step 730) and process the event type with the next highest number of occurrences. This looping continues until processing determines that it should filter an identified event type, at which point decision 720 branches to "Yes" branch 728 whereupon processing configures filter 1 140 to filter the identified event type at step 740. Filter 1 140 is the same as that shown in FIG. 1.

Processing identifies a second event type located in table store 115 with the highest number of occurrences that corresponds to filter 2 150. For example, filter 2 150 may filter a second event category that includes event types "X", "Y", and "Z." Using this example, table store 115 may have three times as many occurrences of event type "X" than either of event type "Y" or event type "Z".

A determination is made as to whether to filter the second event type with the most number of occurrences (decision 760). If processing should not filter the event type with the most number of occurrences, decision 760 branches to "No" branch 762 which loops back to select (step 770) and process the event type with the next highest number of occurrences. This looping continues until processing determines that it should filter an identified event type, at which point decision 760 branches to "Yes" branch 768 whereupon processing configures filter 2 150 to filter the identified event type (step 780). Filter 2 150 is the same as that shown in FIG. 1. Processing returns at 790.

As one skilled in the art can appreciate, this invention may be used to reconfigure more than two filters that are shown in FIG. 7.

Figure 8:
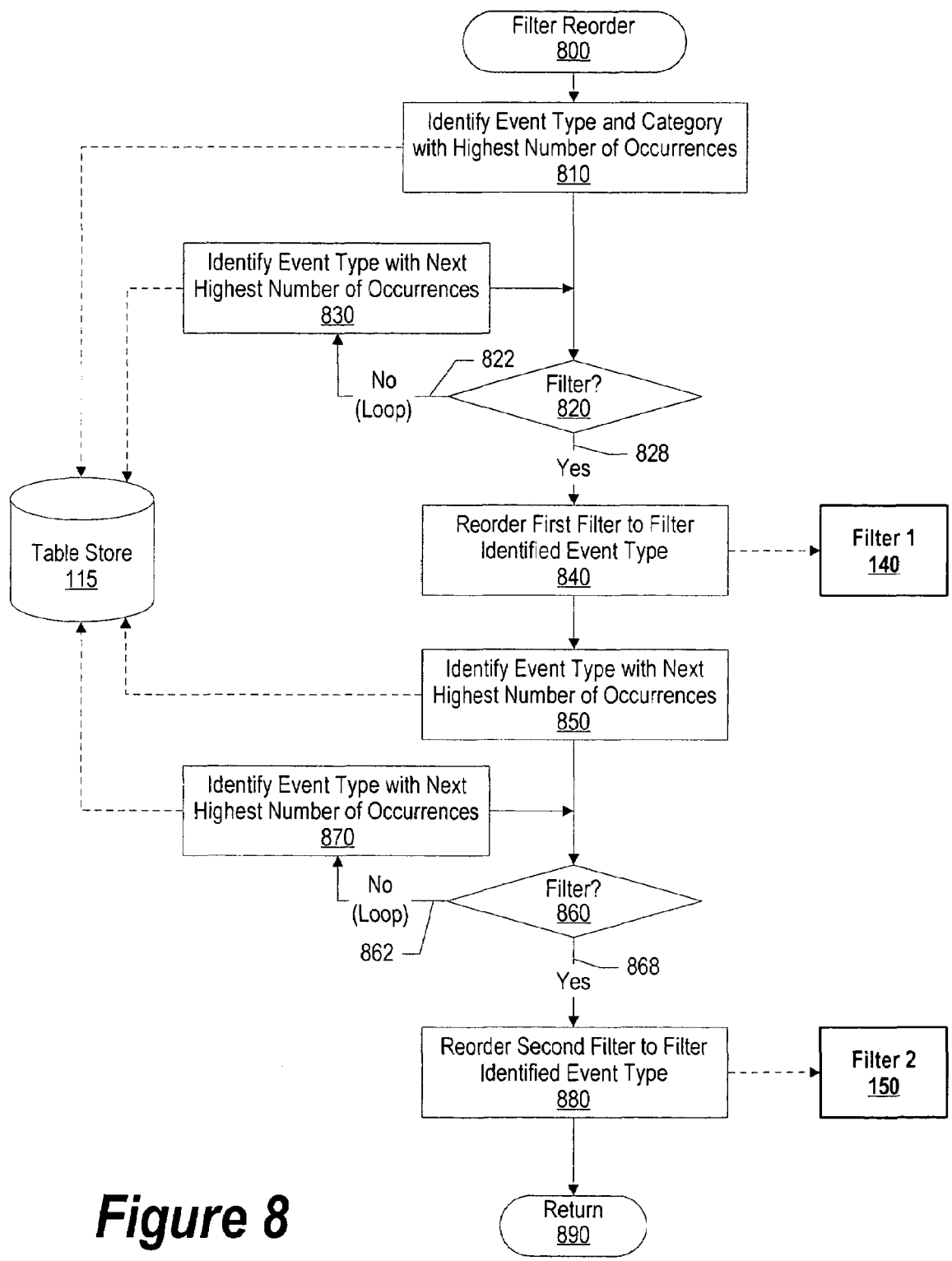
FIG. 8 is a flowchart showing steps taken in reordering filter categories.

FIG. 8 is a flowchart showing steps taken in reordering filter categories. For example, a computer system may have two filters, each filtering a particular category, such as a first filter category and a second category. In this example, the first category may include event types "A", "B", and "C", and the second category may include event types "X", "Y", and "Z".

Processing commences at 800, whereupon processing identifies an event type and category located in table store 115 with the highest number of occurrences (step 810). For example, table store may have three times as many occurrences of a second event type (i.e. "X") as any other event type. Table store 115 is the same as that shown in FIG. 1 and may be stored on a nonvolatile storage area, such as a computer hard drive.

A determination is made as to whether to filter the event type and category with the most number of occurrences (decision 820). Using the example described above, processing determines if it should filter event type X's or whether it should pass event type X's to a second filter. If processing should not filter the event type with the most number of occurrences, decision 820 branches to "No" branch 822 which loops back to select (step 830) and process the event type with the next highest number of occurrences. This looping continues until processing determines that it should filter an identified event type and category, at which point decision 820 branches to "Yes" branch 828 whereupon processing reorders filter 1 140 to filter the identified event type. Filter 1 140 is the same as that shown in FIG. 1.

Processing identifies a second filter category with the next highest number of occurrences at step 850. A determination is made as to whether to filter the category with the most number of occurrences (decision 860). If processing should not filter the event type with the next highest number of occurrences, decision 860 branches to "No" branch 862 which loops back to select (step 870) and process the event type with the next highest number of occurrences. This looping continues until processing determines that it should filter an identified event type, at which point decision 860 branches to "Yes" branch 868 whereupon processing reorders filter 2 150 to filter the identified event type (step 880). Filter 2 150 is the same as that shown in FIG. 1. Processing returns at 890.

As one skilled in the art can appreciate, this invention may be used to reorder more than two filters that are shown in FIG. 8.

Figure 9:
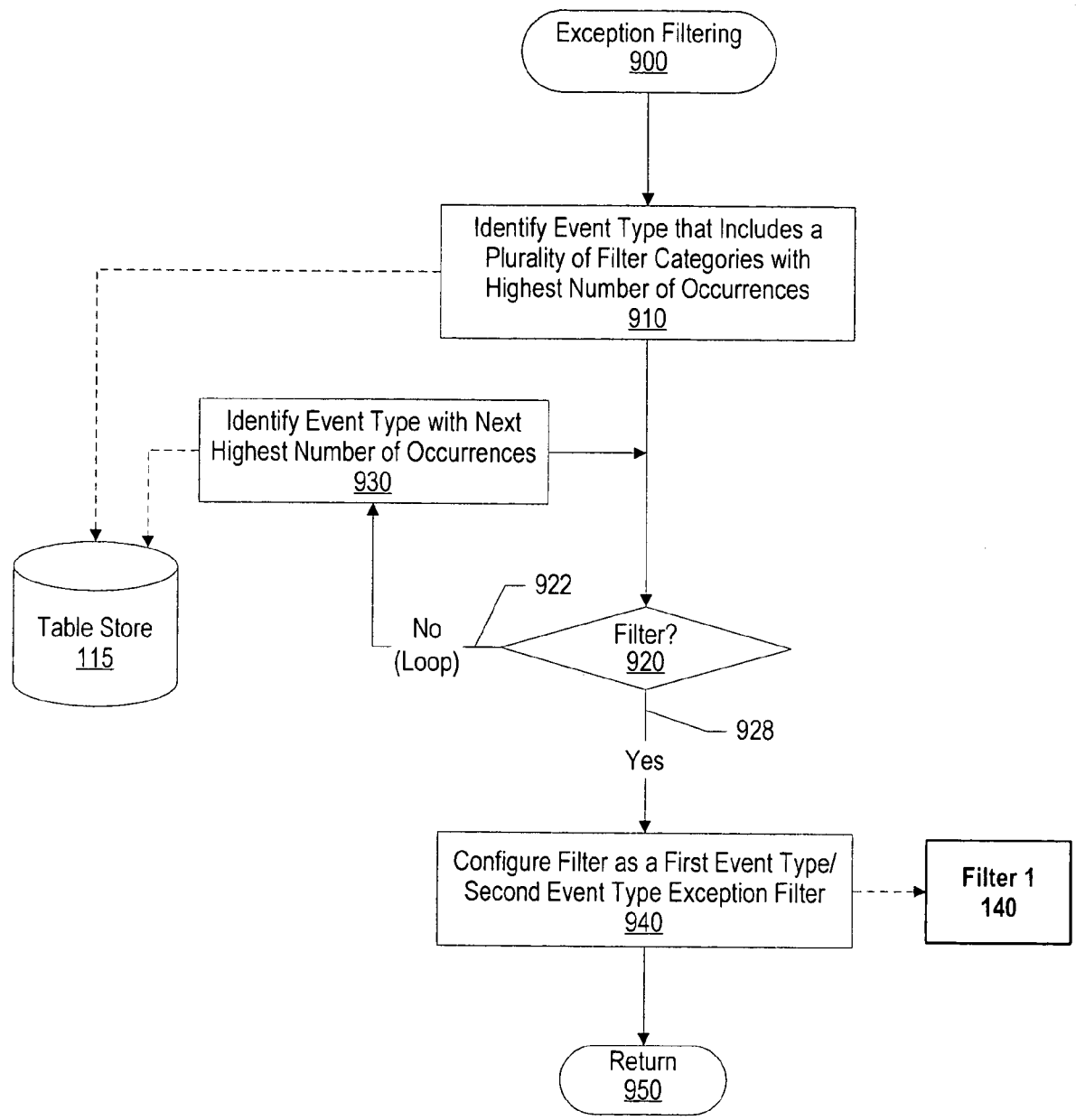
FIG. 9 is a flowchart showing steps taken in configuring a filter as an exception filter.

FIG. 9 is a flowchart showing steps taken in configuring a filter as an exception filter. An exception filter filters events that include a plurality of filter categories. For example, a numerous amount of "AX" events are received whereby "A" is part of a first filter category and "X" is part of a second filter category.

Processing commences at 900, whereupon processing identifies an event type that includes a plurality of filter categories located in table store 115 with the highest number of occurrences, such as "AX" (step 910). Table store 115 is the same as that shown in FIG. 1 and may be stored on a nonvolatile storage area, such as a computer hard drive.

A determination is made as to whether to filter the event type that includes a plurality of filter categories with the most number of occurrences (decision 920). Using the example described above, processing determines if it should filter event types "AX" or whether it should pass event type's "AX" to a second filter. If processing should not filter the event type with the most number of occurrences, decision 920 branches to "No" branch 922 which loops back to select (step 930) the next event type that includes a plurality of filter categories with the next highest number of occurrences. This looping continues until processing determines that it should filter an identified event type that includes a plurality of filter categories, at which point decision 920 branches to "Yes" branch 928 whereupon processing configures filter 1 140 as a exception filter at step 940 to filter event types that include a plurality of filter categories (i.e. "AX"). Processing returns at 950.

Figure 10:
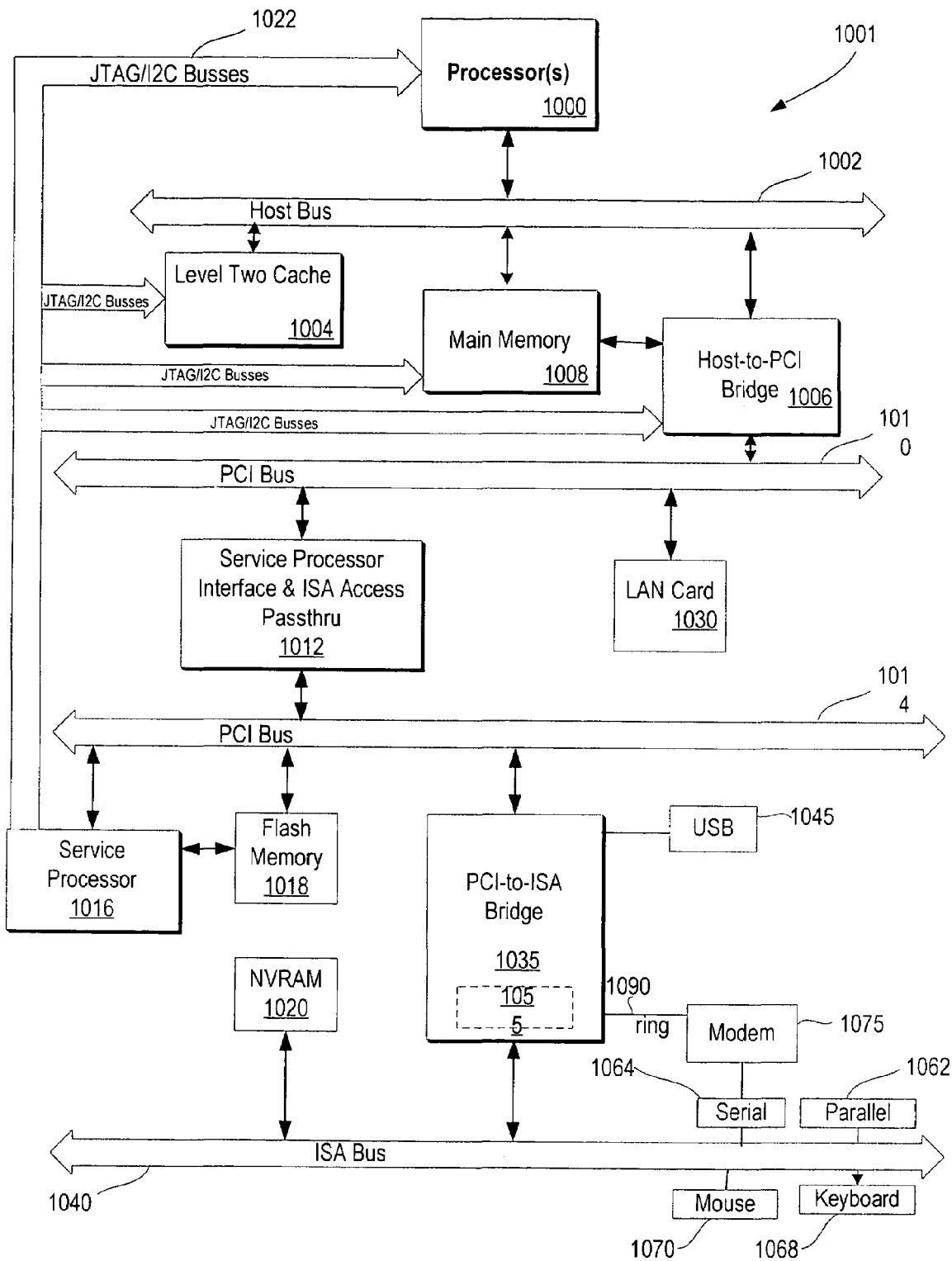
FIG. 10 is a block diagram of an information handling system capable of implementing the present invention.

FIG. 10 illustrates information handling system 1001 which is a simplified example of a computer system capable of performing the computing operations described herein. Computer system 1001 includes processor 1000 which is coupled to host bus 1002. A level two (L2) cache memory 1004 is also coupled to host bus 1002. Host-to-PCI bridge 1006 is coupled to main memory 1008, includes cache memory and main memory control functions, and provides bus control to handle transfers among PCI bus 1010, processor 1000, L2 cache 1004, main memory 1008, and host bus 1002. Main memory 1008 is coupled to Host-to-PCI bridge 1006 as well as host bus 1002. Devices used solely by host processor(s) 1000, such as LAN card 1030, are coupled to PCI bus 1010. Service Processor Interface and ISA Access Pass-through 1012 provides an interface between PCI bus 1010 and PCI bus 1014. In this manner, PCI bus 1014 is insulated from PCI bus 1010. Devices, such as flash memory 1018, are coupled to PCI bus 1014. In one implementation, flash memory 1018 includes BIOS code that incorporates the necessary processor executable code for a variety of low-level system functions and system boot functions.

PCI bus 1014 provides an interface for a variety of devices that are shared by host processor(s) 1000 and Service Processor 1016 including, for example, flash memory 1018. PCI-to-ISA bridge 1035 provides bus control to handle transfers between PCI bus 1014 and ISA bus 1040, universal serial bus (USB) functionality 1045, power management functionality 1055, and can include other functional elements not shown, such as a real-time clock (RTC), DMA control, interrupt support, and system management bus support. Nonvolatile RAM 1020 is attached to ISA Bus 1040. Service Processor 1016 includes JTAG and I2C busses 1022 for communication with processor(s) 1000 during initialization steps. JTAG/I2C busses 1022 are also coupled to L2 cache 1004, Host-to-PCI bridge 1006, and main memory 1008 providing a communications path between the processor, the Service Processor, the L2 cache, the Host-to-PCI bridge, and the main memory. Service Processor 1016 also has access to system power resources for powering down information handling device 1001.

Peripheral devices and input/output (I/O) devices can be attached to various interfaces (e.g., parallel interface 1062, serial interface 1064, keyboard interface 1068, and mouse interface 1070 coupled to ISA bus 1040. Alternatively, many I/O devices can be accommodated by a super I/O controller (not shown) attached to ISA bus 1040.

In order to attach computer system 1001 to another computer system to copy files over a network, LAN card 1030 is coupled to PCI bus 1010. Similarly, to connect computer system 1001 to an ISP to connect to the Internet using a telephone line connection, modem 1075 is connected to serial port 1064 and PCI-to-ISA Bridge 1035.

While the computer system described in FIG. 10 is capable of executing the processes described herein, this computer system is simply one example of a computer system. Those skilled in the art will appreciate that many other computer system designs are capable of performing the processes described herein.

One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer implemented method for handling a plurality of filters, said method comprising:
   receiving first event data corresponding to a first filter from the plurality of filters, the first filter including first filtering properties;
   receiving second event data corresponding to a second filter from the plurality of filters, the second filter including second filtering properties;
   determining whether to change filtering properties of at least one of the plurality of filters using the first event and the second event data;
   changing the filtering properties of at least one of the plurality of filters in response to the determination;
   assigning first filtering properties to the second filter; and
   assigning second filtering properties to the first filter.

2. The method of claim 1 further comprising:
   detecting whether to reconfigure the first filter in response to analyzing the first event data and the second event data, the reconfiguring including adjusting the first filtering properties; and
   reconfiguring the first filter in response to the detecting.

3. The method of claim 1 further comprising:
   identifying whether to configure the first filter as an exception filter, the exception filter configuring including portions of the first filter properties and portions of the second filter properties; and
   configuring the first filter as the exception filter in response to the identifying.

4. The method of claim 1 further comprising:
   retrieving historical trend data; and
   configuring the first filter and the second filter corresponding to the historical trend data.

5. The method of claim 4 wherein the historical trend data is based upon a timeline, and wherein the timeline is selected from a group consisting of a time of day, a time of month, and a time of year.

6. The method of claim 1 wherein the determining further comprises:
   identifying an event type with a highest occurrence number using the first event data and the second event data; and
   comparing the identified event type with the first filtering properties.

7. An information handling system comprising:
   one or more processors;
   a memory accessible by the processors;
   one or more monitor points;
   a plurality of filters;
   one or more nonvolatile storage devices accessible by the processors; and
   filter handling tool for dynamically managing the plurality of filters, the filter handling tool including software code effective to:
      receive first event data from one of the monitor points corresponding to a first filter from the plurality of filters, the first filter including first filtering properties;
      receive second event data from one of the monitor points corresponding to a second filter from the plurality of filters, the second filter including second filtering properties;
      determine whether to change filtering properties of at least one of the plurality of filters using the first event data and the second event data; and
      change the filtering properties of at least one of the plurality of filters in response to the determination.

8. The information handling system of claim 7 wherein the software code is further effective to:
   assign first filtering properties to the second filter; and
   assign second filtering properties to the first filter.

9. The information handling system of claim 7 wherein the software code is further effective to:
   identify whether to configure the first filter as an exception filter, the exception filter configuring including portions of the first filter properties and portions of the second filter properties; and
   configure the first filter as the exception filter in response to the identifying.

10. The information handling system of claim 7 wherein the software code is further effective to:
    retrieve historical trend data from one of the nonvolatile storage devices; and
    configure the first filter and the second filter corresponding to the historical trend data.

11. The information handling system of claim 10 wherein the historical trend data is based upon a timeline, and wherein the timeline is selected from a group consisting of a time of day, a time of month, and a time of year.

12. The information handling system of claim 7 wherein the software code is further effective to:
    identify an event type with a highest occurrence number using the first event data and the second event data; and
    compare the identified event type with the first filtering properties.

13. A computer program product stored on a computer operable media for dynamically handling a plurality of filters, said computer program product comprising software code effective to:
    receive first event data corresponding to a first filter from the plurality of filters, the first filter including first filtering properties;
    receive second event data corresponding to a second filter from the plurality of filters, the second filter including second filtering properties;
    determine whether to change filtering properties of at least one of the plurality of filters using the first event data and the second event data;
    change the filtering properties of at least one of the plurality of filters in response to the determination;
    assign first filtering properties to the second filter; and
    assign second filtering properties to the first filter.

14. The computer program product of claim 13 wherein the software code is further effective to:
    detect whether to reconfigure the first filter in response to analyzing the first event data and the second event data, the reconfiguring including adjusting the first filtering properties; and
    reconfigure the first filter in response to the detecting.

15. The computer program product of claim 13 wherein the software code is further effective to:
    identify whether to configure the first filter as an exception filter, the exception filter configuring including portions of the first filter properties and portions of the second filter properties; and configure the first filter as the exception filter in response to the identifying.

16. The computer program product of claim 13 wherein the software code is further effective to:
retrieve historical trend data; and
configure the first filter and the second filter corresponding to the historical trend data.

17. The computer program product as described in claim 16 wherein the historical trend data is based upon a timeline, and wherein the timeline is selected from a group consisting of a time of day, a time of month, and a time of year.

18. The computer program product as described in claim 13 wherein the software code is further effective to:
identify an event type with a highest occurrence number using the first event data and the second event data; and
compare the identified event type with the first filtering properties.

19. A computer implemented method for handling a plurality of filters, said method comprising:
receiving first event data corresponding to a first filter from the plurality of filters, the first filter including first filtering properties;
receiving second event data corresponding to a second filter from the plurality of filters, the second filter including second filtering properties;
determining whether to change filtering properties of at last one of the plurality of filters using the first event data and the second event data; and
changing the filtering properties of at least one of the plurality of filters in response to the determination, wherein the changing further comprises:
assigning first filtering properties to the second filter; and
assigning second filtering properties to the first filter.

20. A computer implemented method for handling a plurality of filters, said method comprising:
retrieving historical trend data, wherein the historical trend data is based upon a timeline, and wherein the timeline is selected from a group consisting of a time of day, a time of month, and a time of year;
pre-configuring a first filter and a second filter corresponding to the historical trend data;
receiving first event data corresponding to the first filter from the plurality of filters, the first filter including first filtering properties;
receiving second event data corresponding to the second filter from the plurality of filters, the second filter including second filtering properties;
determining whether to change filtering properties of at least one of the plurality of filters using the first event data and the second event data; and
changing the filtering properties of at least one of the plurality of filters in response to the determination.

21. An information handling system comprising:
one or more processors;
a memory accessible by the processors;
one or more monitor points;
a plurality of filters;
one or more nonvolatile storage devices accessible by the processors; and
a filter handling tool for dynamically managing the plurality of filters, the filter handling tool comprising software code effective to:
receive first event data from one of the monitor points corresponding to a first filter from the plurality of filters, the first filter including first filtering properties;
receive second event data from one of the monitor points corresponding to a second filter from the plurality of filters, the second filter including second filtering properties;
determine whether to change filtering properties of at least one of the plurality of filters using the first event data and the second event data; and
change the filtering properties of at least one of the plurality of filters in response to the determination, wherein the changing further comprises:
assign first filtering properties to the second filter; and
assign second filtering properties to the first filter.

22. A computer program product stored on a computer operable media for dynamically handling a plurality of filters, said computer program product comprising software code effective to:
receive first event data corresponding to a first filter from the plurality of filters, the first filter including first filtering properties;
receive second event data corresponding to a second filter from the plurality of filters, the second filter including second filtering properties;
determine whether to change filtering properties of at least one of the plurality of filters using the first event data and the second event data; and
change the filtering properties of at least one of the plurality of filters in response to the determination, wherein the software code is further effective to:
assign first filtering properties to the second filter; and
assign second filtering properties to the first filter.

* * * * *

UNITED STATES PATENT AND TRADEMARK OFFICE
CERTIFICATE OF CORRECTION

PATENT NO. : 7,027,962 B2  
APPLICATION NO. : 10/717678  
DATED : April 11, 2006  
INVENTOR(S) : J. Hayo et al.

Page 1 of 1

It is certified that error appears in the above-identified patent and that said Letters Patent is hereby corrected as shown below:

<u>Column 11</u>
Line 20, insert --data-- before "and the second event data;"

<u>Column 13</u>
Line 27, replace "last" with --least--

Signed and Sealed this

First Day of August, 2006

JON W. DUDAS  
*Director of the United States Patent and Trademark Office*